(12) United States Patent
Fackenthal et al.

(10) Patent No.: US 7,848,133 B2
(45) Date of Patent: Dec. 7, 2010

(54) PHASE CHANGE MEMORY WITH BIPOLAR JUNCTION TRANSISTOR SELECT DEVICE

(75) Inventors: Richard Fackenthal, Carmichael, CA (US); Meenatchi Jagasivamani, Fairfield, CA (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 12/006,254

(22) Filed: Dec. 31, 2007

(65) Prior Publication Data

US 2009/0168503 A1 Jul. 2, 2009

(51) Int. Cl.
*G11C 11/00* (2006.01)
(52) U.S. Cl. .................. 365/148; 365/163; 365/230.03
(58) Field of Classification Search ...................... 365/46
See application file for complete search history.

(56) References Cited

U.S. PATENT DOCUMENTS

| | | | | |
|---|---|---|---|---|
| 7,203,087 B2* | 4/2007 | Resta et al. | | 365/148 |
| 7,215,592 B2* | 5/2007 | Cho et al. | | 365/230.06 |
| 7,248,494 B2* | 7/2007 | Oh et al. | | 365/148 |
| 7,463,546 B2* | 12/2008 | Fasoli et al. | | 365/230.06 |
| 7,515,460 B2* | 4/2009 | Gordon et al. | | 365/163 |
| 7,633,788 B2* | 12/2009 | Choi et al. | | 365/148 |
| 2005/0024933 A1* | 2/2005 | Pellizzer et al. | | 365/163 |
| 2007/0217273 A1* | 9/2007 | Choi et al. | | 365/200 |
| 2008/0158941 A1* | 7/2008 | Choi et al. | | 365/163 |
| 2009/0073752 A1* | 3/2009 | Fackenthal et al. | | 365/163 |
| 2009/0161417 A1* | 6/2009 | Fackenthal et al. | | 365/163 |

\* cited by examiner

*Primary Examiner*—Tan T. Nguyen
(74) *Attorney, Agent, or Firm*—Trop, Pruner & Hu, P.C.

(57) ABSTRACT

A phase change memory may be organized with a global word line coupled to a plurality of blocks, each with a plurality of phase change memory cells arranged in rows and columns. Thus, one global word line may be common to a plurality of blocks. The global word line may be coupled to a word line decoder that is responsible for pulling the word line to ground. Each of the blocks, on the other hand, is coupled to a bitline selector through a bitline. Each block may have its own local word line coupled to the global word line. In some cases, this architecture reduces the minimum capacity of the memory.

13 Claims, 1 Drawing Sheet

PHASE CHANGE MEMORY WITH BIPOLAR JUNCTION TRANSISTOR SELECT DEVICE

BACKGROUND

This invention relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change material is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
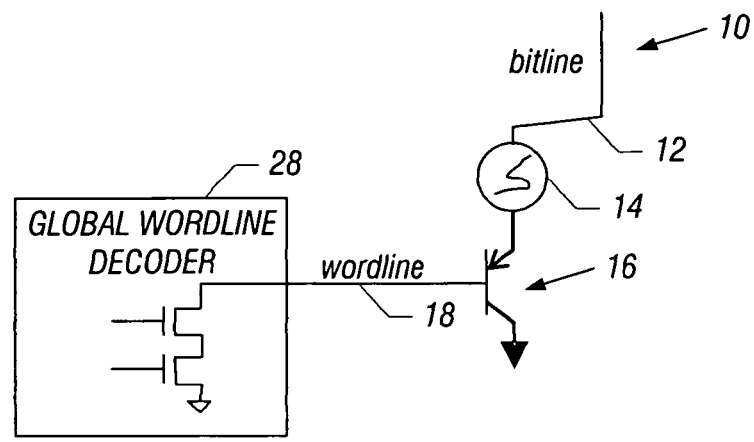
FIG. 1 is a depiction of a cell and word line decoder in accordance with one embodiment of the present invention.

Referring to FIG. 1, in accordance with one embodiment of the present invention, a cell 10 may be connected to a bitline 12. The cell may include a phase change memory element 14 coupled to a select device 16. The select device 16 may be a bipolar junction transistor and, in one embodiment, may be a PNP bipolar junction transistor. The emitter of the bipolar junction transistor 16 is coupled to the phase change memory element 14. The base of the bipolar junction transistor 16 is coupled by a word line 18 to a global word line decoder 28.

Figure 2:
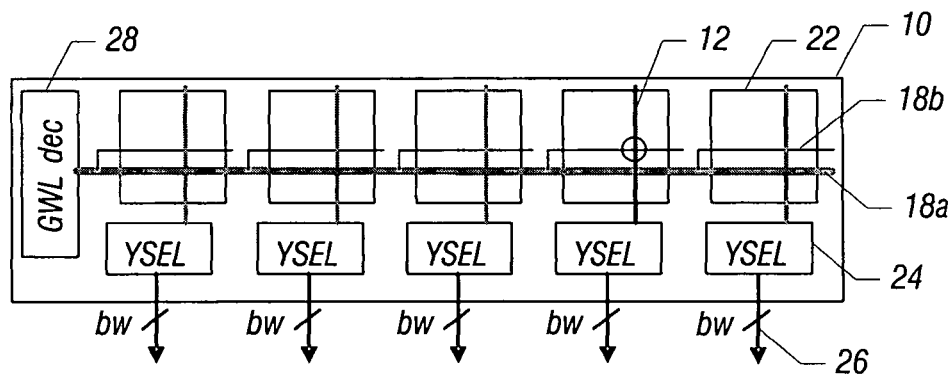
FIG. 2 is a depiction of a plane in accordance with one embodiment of the present invention.

The memory including cells 10, in accordance with one embodiment of the present invention shown in FIG. 2, may include a plane 30. The plane 30 may include a plurality of blocks 22. A plurality of planes 30 may each be connected to a global word line decoder 28 (although only one plane 30 is shown in FIG. 2). In one embodiment of the present invention, a plurality of planes may make up a tile.

Each global word line decoder 28 is coupled to each of the blocks 22 of the plane 30. Each block 22 may be coupled through a local word line 18b. Each local word line 18b is coupled to a global word line 18a, which then connects to the global word line decoder 28.

A cell 10 may be selected on a particular bitline 12. Each block 22 may have one selected cell selected at the same time as a plurality of other cells in different blocks within the same plane 30. Each selected cell on the selected bitline 12 may be coupled to a Y select decoder 24 or bitline decoder 24. Each Y select decoder 24 is then connected to a number of output lines such that the number of output lines equals the read bandwidth or number of bits per tile.

In order to program a cell 10, a selected bitline 12 may be pulled to a high voltage and a selected word line 18 may be grounded in one embodiment. This forward biases the emitter base diode in the select device 16 and provides a current path from the bitline 12 to ground through each cell 10. The selected word line may be grounded, while the unselected word lines may be pulled up to a high voltage.

To program the bit cell, a high current is applied through the bit cell. However, some of the emitter (bitline) current runs through the base of the select device 16 and the word line 18. This word line current is pulled down by the global word line decoder to ground. Therefore, the global word line decoder 28 is sized large enough to pull down this current and still maintain the voltage close to ground. In order to pull down multiple bit cells, a word line pull down device within the decoder is sized reasonably large. The global word line decoder need not be large because it need not contain devices which are sinking the word line current. The local word line decoders include the devices that sink the word line current. In one embodiment, the local word line decoder includes only one pull down device, so the local word line decoders may also be compactly laid out.

In accordance with some embodiments, the data in one address location is split among multiple blocks. Each block outputs a number of bits equal to the bandwidth (BW) limit. The word lines from these multiple blocks are controlled hierarchically through the global word line 18a. This allows the local word lines 18b to be physically separate, even though they are electrically the same.

A traditional flash memory architecture has the array partitioned into planes, with each plane containing multiple blocks. The same word line is selected in each of the blocks and the bitlines from one of the blocks in the plane is output onto global bitlines. Because there is no limit on how many cells can be accessed from one word line, the minimum capacity is not excessive.

However, for a phase change memory with a bipolar junction transistor select device, only a limited number of bit cells can be accessed from one word line at a time. Therefore, the number of tiles may be increased to support the required data width. The hierarchical word line architecture allows for a bipolar select device and a phase change memory to have a lower minimum capacity, especially for sizes with high sense bandwidth.

Generally, any memory (including a phase change memory) is segmented into a plurality of pieces. A phase change memory array is broken into pieces called tiles. The reason for segmenting the array is because of the problems related to parasitics and in order to enable redundancy or replacement of bad segments without having to replace the entire memory.

Sense bandwidth is the number of bits that a memory can output at one instance. Tile bandwidth then is the sense bandwidth of a single tile and core bandwidth is the sense bandwidth of the entire core at one time. Thus, for example, if a memory, such as a phase change memory, has a 128 bit core bandwidth, 128 cells must be accessed at the same time, buffered, and made available to the user.

With a phase change memory, using a bipolar junction transistor access device, the current from all the cells runs down the word line (not to a common source rail, as would be the case in flash memories). Thus, in a phase change memory, the more cells on the word line that are accessed at the same time, the higher the word line current.

Generally, because of considerations of resistance, a sense bandwidth of eight bits per word line may be advantageous in many cases. Thus, in order to get 128 bits of core bandwidth, with eight bits per tile of tile bandwidth, sixteen tiles may be ganged to output eight bits from each of sixteen tiles at the same time. Other core bandwidths and tile bandwidths per word line may also be used.

In a row sharing arrangement, as described herein, with a global word line, only sixteen tiles are needed to output 128 bits. In a column sharing approach however, because the sense bandwidth is one bit from each column, only eight bits of sense bandwidth is available from a group of eight tiles. So, with the column sharing approach, to get 128 bits of core bandwidth, sixteen groups of sixteen tiles may be ganged to achieve the necessary sense bandwidth. However, because there are 256 tiles, the combined capacity of so many columns being accessed at the same time, in so many tiles, may be excessive. In contrast, in some embodiments, with a row sharing approach, more bits can be outputted for the same number of tiles, thereby reducing the capacity and improving the performance.

Programming of the phase change material to alter the state or phase of the material may be accomplished by applying voltage potentials to the word line 18 and bitline 12, thereby generating a voltage potential across any select device and memory element including a phase change material. When the voltage potential is greater than the threshold voltages of any select device and memory element, then an electrical current may flow through the element in response to the applied voltage potentials, and may result in heating of the phase change material.

This heating may alter the memory state or phase or at least a portion thereof. Altering the phase or state may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 3:
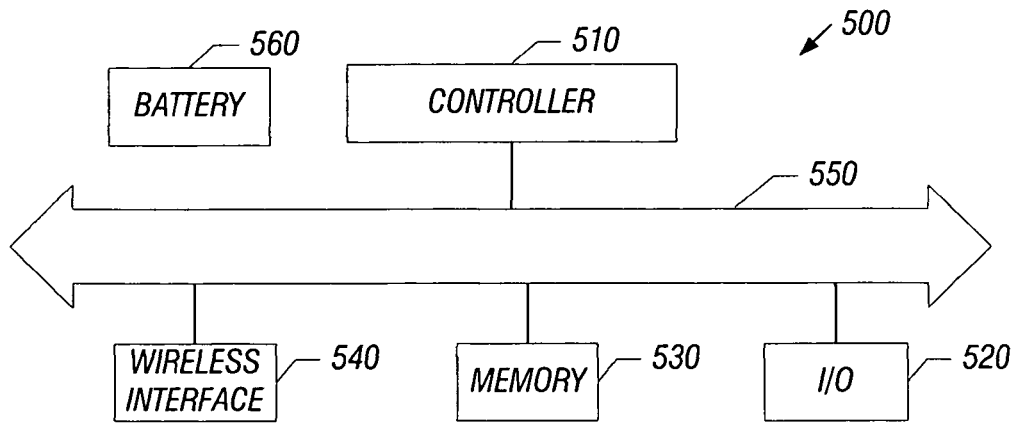
FIG. 3 is a depiction of a system in accordance with one embodiment of the present invention.

Turning to FIG. 3, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
providing a phase change memory including a plurality of cells including a phase change memory element and a bipolar junction select transistor;
organizing groups of cells into blocks and providing a plurality of blocks with one global word line decoder coupled to the blocks by a global word line, each block having a separate local word line coupled to said global word line;
using said global word line decoder to pull down the global word line to ground; and
providing a different bitline selector for each block.

2. The method of claim 1 including coupling each block by a bitline to a bitline selector, each block outputting one tile bandwidth.

3. The method of claim 1 including splitting the data for one address location among a plurality of blocks.

4. The method of claim 1 including outputting, from the bitline selector, a tile bandwidth.

5. A phase change memory comprising:
a plurality of cells, each cell including a memory element and a bipolar junction transistor;
a plurality of blocks of cells;
a global word line;
a global word line decoder coupled to each of said blocks through said global word line, each block including a separate local word line coupled to said global word line, said global word line decoder to pull down the global word line to ground; and a different bitline selector for each block.

6. The memory of claim 5 including a different bitline coupled to each of said blocks and a bitline selector coupled to said bitlines.

7. The memory of claim 6 wherein each block outputs one tile bandwidth.

8. The memory of claim 5 including said bitline selector to output one tile bandwidth.

9. A processor-based system comprising:

a processor;

a static random access memory coupled to said processor; and a phase change memory coupled to said processor, said phase change memory including a plurality of cells, each cell including a phase change memory element and a bipolar junction transistor, a plurality of blocks of cells, a global word line, and a global word line decoder coupled to each of said blocks through said global word line, each block including a separate local word line coupled to said global word line, and a different bitline selector for each block.

10. The system of claim 9 including a different bitline coupled to each of said blocks and a bitline selector coupled to said bitlines.

11. The system of claim 10 wherein each block outputs one tile bandwidth.

12. The system of claim 9, said global word line decoder to pull down the global word line to ground.

13. The system of claim 9 including said bitline selector to output one tile bandwidth.

* * * * *